United States Patent
Toda et al.

(10) Patent No.: US 8,420,449 B2
(45) Date of Patent: Apr. 16, 2013

(54) LASER PATTERNING APPARATUS AND LASER PATTERNING METHOD

(75) Inventors: Masaaki Toda, Tamana (JP); Satoshi Sawayanagi, Ichihara (JP)

(73) Assignee: Fuji Electric Co., Ltd. (JP)

( * ) Notice: Subject to any disclaimer, the term of this patent is extended or adjusted under 35 U.S.C. 154(b) by 49 days.

(21) Appl. No.: 13/234,825

(22) Filed: Sep. 16, 2011

(65) Prior Publication Data
US 2012/0070932 A1  Mar. 22, 2012

(30) Foreign Application Priority Data
Sep. 17, 2010 (JP) .................................. 2010-208750

(51) Int. Cl.
*H01L 21/50*  (2006.01)
*H01L 21/48*  (2006.01)
*H01L 21/46*  (2006.01)

(52) U.S. Cl.
USPC ........................... 438/125; 438/457; 438/484

(58) Field of Classification Search .................. 438/125, 438/457, 484
See application file for complete search history.

(56) References Cited

U.S. PATENT DOCUMENTS

| 6,815,259 B2 * | 11/2004 | Ninomiya et al. | ............ 438/125 |
| 6,827,787 B2 * | 12/2004 | Yonezawa et al. | ............ 118/718 |
| 7,666,766 B2 * | 2/2010 | Hiura et al. | ................... 438/484 |

FOREIGN PATENT DOCUMENTS

| JP | 08-090271 A | 4/1996 |
| JP | 10-015686 A | 1/1998 |
| JP | 10-305544 A | 11/1998 |
| JP | 2009-206235 A | 10/2009 |

* cited by examiner

*Primary Examiner* — Luan C Thai
(74) *Attorney, Agent, or Firm* — Rossi, Kimms & McDowell LLP

(57) ABSTRACT

Aspects of the invention are directed to laser patterning apparatus capable of performing laser patterning on a thin film formed on a flexible substrate with a good yield and a laser patterning method thereof. The thin film formed on the flexible substrate can be patterned by laser using a laser patterning apparatus that can include a processing stage that has a reference processing surface on which the flexible substrate having the thin film formed thereon is disposed, a wrinkle removing device that is configured as a mechanism for stretching an outer periphery of a processing region of the flexible substrate so that tension is applied outward in the width direction and forward and backward in the transporting direction, and a laser scanner that scans a predetermined line of the thin film formed on the flexible substrate while emitting a laser beam thereto.

14 Claims, 6 Drawing Sheets

LASER PATTERNING APPARATUS AND LASER PATTERNING METHOD

BACKGROUND OF THE INVENTION

1. Field of the Invention

Embodiments of the invention relate to laser patterning apparatuses and laser patterning methods.

2. Description of the Related Art

A thin-film photovoltaic device can be structured such that a plurality of photovoltaic elements are formed on an insulating substrate, where each photovoltaic element is formed of thin films of a first electrode layer, a photoelectric conversion layer, and a second electrode layer laminated at a single region. In addition, the first electrode of a photovoltaic element and the second electrode of the adjacent photovoltaic element are electrically connected in series to output a necessary voltage. The photovoltaic elements connected in series in this manner are formed by film forming and patterning of each layer and a combination of those. In the patterning, it is necessary to process a second patterning line to overlap a first patterning line obtained through the former processes. For this reason, the patterning demands high precision, and hence laser patterning with good processing precision is widely used.

Hitherto, a glass substrate has been used as the substrate of the thin-film photovoltaic device, but in recent years, a flexible substrate such as a plastic film is increasingly being used. The thin-film photovoltaic device using the flexible substrate is lightweight and has good operability. Furthermore, thanks to the flexibility, the thin-film photovoltaic device can be massively produced by a roll-to-roll method.

However, warpage, looseness, wrinkles, and the like easily occur in the flexible substrate, and flatness of the laser processing surface easily deteriorates. For this reason, in the flexible substrate, the processing precision of the laser patterning easily deteriorates as compared with the glass substrate.

Therefore, when the laser patterning is performed on a thin film formed on the surface of the flexible substrate, as disclosed in Japanese Patent Application Laid-Open No. 10-15686 (see paragraph [0019] and FIG. 4) and Japanese Patent Application Laid-Open No. H08-90271 (see paragraph [0010] and FIG. 4), the laser patterning is performed in a manner such that the flexible substrate is disposed on a processing stage in a state in which both ends of the flexible substrate are stretched by the tension applied in the direction perpendicular to the transporting direction.

However, in some cases, warpage, looseness, wrinkles, and the like are not sufficiently removed even if tension is applied to both ends of the flexible substrate in the direction perpendicular to the transporting direction. For example, there is a need to increase tension to remove the looseness or the warpage when the looseness or the warpage of the flexible substrate is large. However, wrinkles easily occur along the transporting direction when the tension increases. In addition, the linearity, the line width, or the like deteriorates, product defects occur, and the yield thereof deteriorates when the laser patterning is performed in the presence of the wrinkles and the like.

SUMMARY OF THE INVENTION

Therefore, embodiments of the invention provide a laser patterning apparatus capable of performing laser patterning on a thin film formed on a flexible substrate and a laser patterning method thereof.

To do so, according to an aspect of the invention, there is provided a laser patterning apparatus including a processing unit that has a reference processing surface on which a flexible substrate having a thin film formed thereon and transported by a roll-to-roll method is disposed, a wrinkle removing device that removes wrinkles of the flexible substrate disposed on the reference processing surface, and a laser beam scanner that emits a laser beam to the thin film formed on the flexible substrate to scan the thin film along a predetermined line, wherein the wrinkle removing device is configured as a stretching mechanism that stretches an outer periphery of a processing region of the flexible substrate such that tension is applied outward in the width direction and forward and backward in the transporting direction.

In the laser patterning apparatus of the aspect of the invention, since the wrinkle removing device is configured as the stretching mechanism that stretches the outer periphery of the processing region of the flexible substrate such that tension is applied outward in the width direction and forward and backward in the transporting direction, the flexible substrate can be fixed to the reference processing surface in an extremely flat state without warpage, looseness, wrinkles, and the like. For this reason, the flexible substrate can be patterned by use of laser with a high degree of processing precision.

In the laser patterning apparatus of the aspect of the invention, the reference processing surface may be formed in a shape that comes into contact with only the peripheral edge of the flexible substrate. In this aspect, the processing unit may include a residual dust suctioning portion provided at a back surface side of an inner portion of the reference processing surface wherein the inner portion does not come into contact with the flexible substrate. According to this aspect, even when residual dust comes around the back surface of the flexible substrate during the laser patterning, the residual dust is removed from the suctioning portion. Accordingly, it is possible to solve a problem that the residual dust adheres to the back surface of the flexible substrate.

In the laser patterning apparatus of the aspect of the invention, the reference processing surface may be formed in a shape that comes into contact with at least a back surface side of the processing region of the flexible substrate. According to this aspect, it is possible to more effectively remove looseness or warpage of the flexible substrate. The aspect is especially effective when the film stress of the thin film formed on the flexible substrate is large and warpage or looseness is large.

In the laser patterning apparatus of the aspect of the invention, the processing unit may include a processing stage with a suction mechanism that suctions the flexible substrate coming into contact with the reference processing surface onto the reference processing surface. Then, the suction mechanism may include a suction surface with a suction hole and a mechanism that suctions the inside of the suction surface. According to this aspect, since it is possible to fix the flexible substrate to the reference processing surface by means of suctioning, looseness or warpage of the flexible substrate may be more effectively removed. In addition, wrinkles also may be effectively removed.

In the laser patterning apparatus of the aspect of the invention, the wrinkle removing device may include a plate that is formed of a material not damaging the flexible substrate and a driving mechanism that presses the plate against the flexible substrate and moves the plate toward an outer periphery of the processing unit.

In the laser patterning apparatus of the aspect of the invention, the wrinkle removing device may include a roller that is formed of a material not damaging the flexible substrate and a rotating mechanism that presses the roller against the flexible substrate and rotates the roller so that the flexible substrate moves toward an outer periphery of the processing unit.

In the laser patterning apparatus of the aspect of the invention, the wrinkle removing device may include a gripping mechanism that grips and stretches both sides of the flexible substrate, the gripping mechanism may include gripping portions that are provided at least three positions for each side of the processing unit along the transporting direction and is formed of a material not damaging the flexible substrate, and the gripping portion may be configured such that the stretching direction and the stretching force are individually adjustable. The gripping portion may be configured such that the stretching direction is adjustable in an angular range from 30° to 150° with respect to the transporting direction of the flexible substrate. Further, the gripping portion may include a pair of rollers that pinches both surfaces of the flexible substrate.

Further, according to another aspect of the invention, there is provided a laser patterning method including: disposing a flexible substrate on a reference processing surface of a processing unit while transporting the flexible substrate having a thin film formed thereon by a roll-to-roll method; removing wrinkles of the flexible substrate by stretching an outer periphery of a processing region of the flexible substrate so that tension is applied outward in the width direction and forward and backward in the transporting direction; and patterning the thin film formed on the flexible substrate by use of a laser beam in such a state.

In the laser patterning method of the another aspect of the invention, the reference processing surface to be used may have a shape that comes into contact with only the peripheral edge of the flexible substrate, and the wrinkles of the flexible substrate may be removed in a manner such that only the peripheral edge of the flexible substrate, which is other than the processing region of the flexible substrate, comes into contact with the reference processing surface while the flexible substrate is being transported by a roll-to-roll method, and is stretched toward the outer periphery of the reference processing surface while the peripheral edge of the flexible substrate is pressed against the reference processing surface.

In the laser patterning method of the aspect of the invention, the reference processing surface to be used may have a shape that comes into contact with at least a back surface side of the processing region of the flexible substrate, and the wrinkles of the flexible substrate may be removed in a manner such that the back surface of the processing region of the flexible substrate comes into contact with the reference processing surface while the flexible substrate is being transported by a roll-to-roll method, both sides of the flexible substrate are gripped by gripping portions provided at least three positions for each side of the processing unit along the transporting direction, and the flexible substrate is stretched by the gripping portions so that tension is applied outward in the width direction of the flexible substrate and forward and backward in the transporting direction.

According to the above-described aspects of the invention, since the flexible substrate can be fixed to the reference processing surface in the extremely flat state without warpage, looseness, wrinkles, and the like, the flexible substrate can be patterned by use of laser with a high degree of processing precision.

DETAILED DESCRIPTION OF THE PREFERRED EMBODIMENTS

A "flexible substrate with thin films formed thereon" used in the invention is not particularly limited, and any type may be desirably used. For example, a thin-film photovoltaic device or the like may be used in which thin films such as a thin semiconductor film and a thin metal film are formed on the surface of a resinous film formed of polyethylene telephthalate (PET), polyether sulfone (PES), polyethylene naphthalate (PEN), polyarylate (PAR), polyamide imide (PAI), polybenzimidazole (PBI), polysulfone (PSF), or the like. Hereinafter, a case will be exemplified in which a thin-film photovoltaic device formation substrate is used as the "flexible substrate with thin films formed thereon."

First Embodiment

Figure 1:
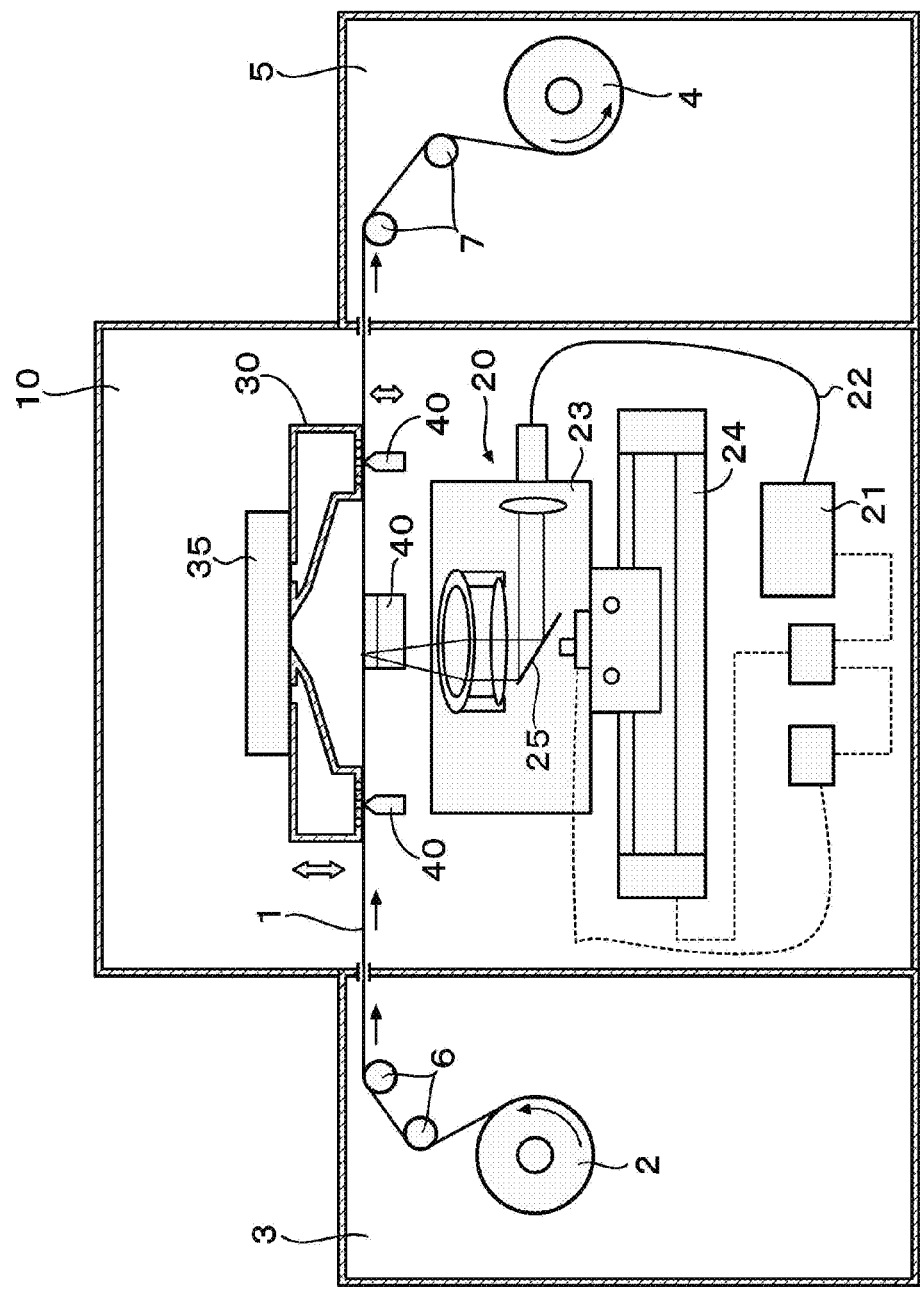
FIG. 1 is a schematic diagram illustrating a configuration of a laser patterning apparatus according to a first embodiment of the invention.

A laser patterning apparatus according to a first embodiment of the invention will be described by referring to FIGS. 1 to 3. As shown in FIG. 1, the laser patterning apparatus mainly includes an unwinding room 3, a winding room 5, and a laser processing room 10. The unwinding room accommodates an unwinding roll 2 having a thin-film photovoltaic device formation substrate 1 wound thereon. The winding room 5 accommodates a winding roll 4 for winding the thin-film photovoltaic device formation substrate 1. The laser processing room 10 is disposed between the unwinding room 3 and the winding room 5 in the transporting direction (the direction indicated by the arrow in FIG. 1) of the thin-film photovoltaic device formation substrate 1.

A plurality of (two in the embodiment) guide rollers 6 and 7 are provided in the unwinding room 3 and the winding room 5 so as to make tension applied to the thin-film photovoltaic device formation substrate 1 uniform while guiding the thin-film photovoltaic device formation substrate 1.

A laser processing unit 20, a processing stage 30, and a wrinkle removing device 40 are disposed in the laser processing room 10.

The laser processing unit 20 is a device that patterns a laser processing surface of the thin-film photovoltaic device formation substrate 1 by emitting a laser beam to the processing surface, and is disposed to face the laser processing surface of the thin-film photovoltaic device formation substrate 1.

The laser processing unit 20 includes a laser oscillator 21, an optical fiber 22 that guides a laser beam output from the laser oscillator 21 to a laser output system 23, and an XY stage 24 that moves the laser output system 23 in the X-Y direction. Further, the laser output system 23 includes a laser mirror 25 that reflects the laser beam output from the laser oscillator 21 so that the laser beam is guided to the laser processing surface of the thin-film photovoltaic device formation substrate 1.

The processing stage 30 is used to dispose and fix the thin-film photovoltaic device formation substrate 1 at a predetermined position of the reference processing surface, and is configured to be elevatable by an elevating device (not shown).

Figure 2:
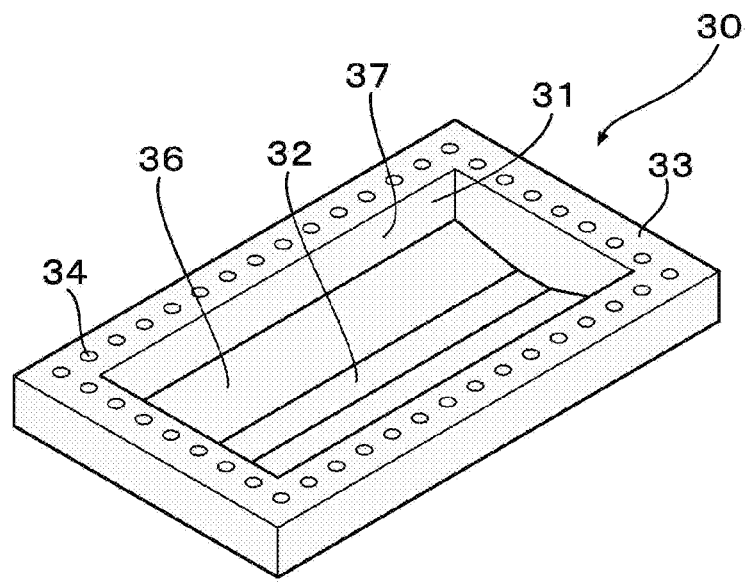
FIG. 2 is a schematic diagram illustrating a processing stage used in the laser patterning apparatus.

Referring to FIG. 2, the processing stage 30 includes a frame-shaped reference processing surface 33, with the inner periphery forming an opening 31. Then, the back surface side of the opening 31 is surrounded by a peripheral wall 37 that is perpendicular to the reference processing surface 33, a bottom wall 36 that extends and decreases in size from the bottom portion of the peripheral wall 37 in the longitudinal direction toward the center, and a slit-like opening 32 that is formed at the center of the bottom wall 36. The slit-like opening 32 forms a discharge port for discharging residual dust generated during laser patterning. The residual dust is discharged outside the system through the slit-like opening 32 when a suction device 35 (refer to FIG. 1) suctions the residual dust by a negative pressure generated therefrom.

A plurality of suction holes 34 are formed in the reference processing surface 33. When the suction device 35 suctions the suction holes 34 by the negative pressure generated therefrom, the thin-film photovoltaic device formation substrate 1 is suctioned and fixed to the reference processing surface 33.

The diameter of each suction hole 34 is desirably from $\phi 0.3$ to $\phi 1.5$ mm and more desirably from $\phi 0.5$ to $\phi 1.0$ mm. When the diameter of the suction hole 34 is larger than $\phi 2.0$ mm, there is a concern that the thin-film photovoltaic device formation substrate 1 deforms during suctioning and fixing the thin-film photovoltaic device formation substrate.

Figure 3:
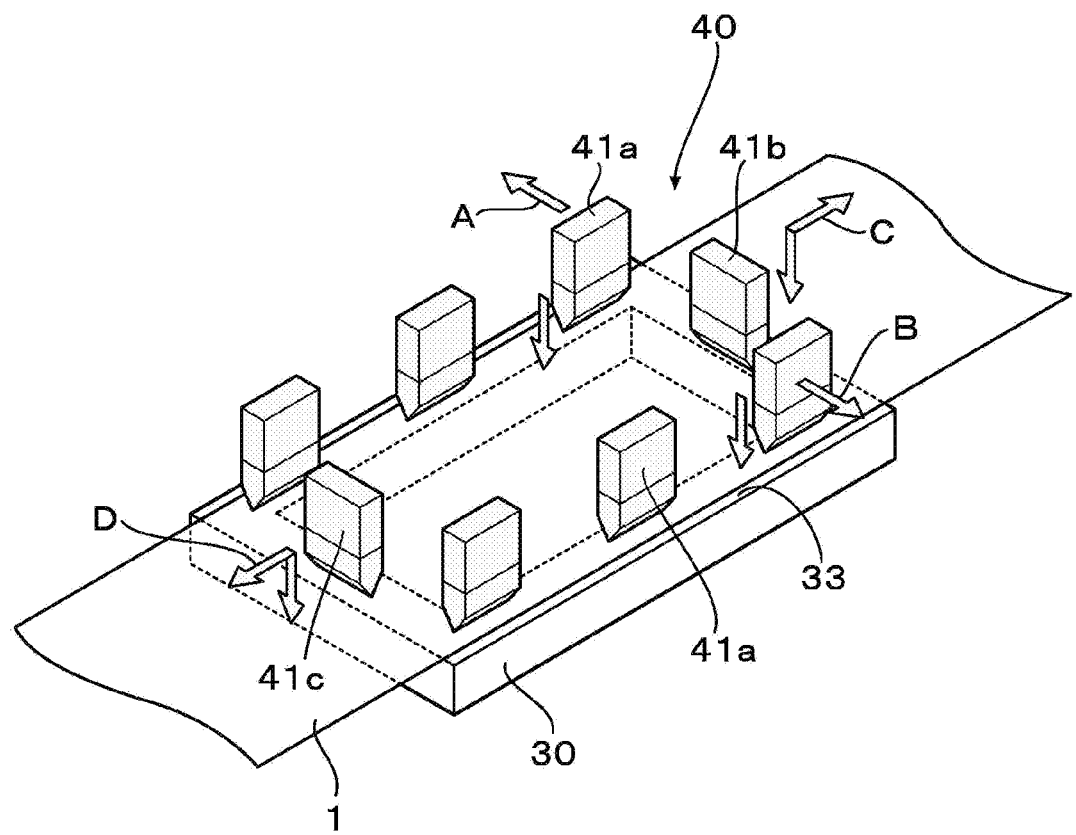
FIG. 3 is a schematic diagram illustrating a wrinkle removing device used in the laser patterning apparatus.

Referring to FIG. 3, the wrinkle removing device 40 is a device for removing the wrinkles of the thin-film photovoltaic device formation substrate 1 disposed on the processing stage 30, and is used as a stretching mechanism that stretches the outer periphery of the processing region of the thin-film photovoltaic device formation substrate 1 so that tension is applied outward in the width direction (the directions A and B of FIG. 3) and forward and backward in the transporting direction (the directions C and D of FIG. 3).

The wrinkle removing device 40 includes a plate 41 that is formed of a material not damaging the thin-film photovoltaic device formation substrate 1, and the plate is disposed at a plurality of positions (eight positions in the embodiment) along the reference processing surface 33. The material of the plate 41 is not particularly limited, and rubber-based materials such as silicon rubber and urethane rubber may be used. The plate 41 is away from the thin-film photovoltaic device formation substrate 1 by a predetermined distance when the thin-film photovoltaic device formation substrate 1 is being transported and positioned. However, when the wrinkles of the thin-film photovoltaic device formation substrate 1 are removed, the plate 41 is driven under the control of a control device (not shown) such that the plate 41 firmly presses a portion of the thin-film photovoltaic device formation substrate 1 positioned on the reference processing surface 33 and the plate 41 moves toward the outer periphery of the processing stage 30 in such a state.

That is, in this embodiment, at the time of removing the wrinkles of the thin-film photovoltaic device formation substrate 1, the plates 41a disposed at both sides of the reference processing surface 33 are driven under the control such that the plates 41a horizontally move outward in the width direction (the directions A and B of FIG. 3) of the thin-film photovoltaic device formation substrate 1 while firmly pressing the thin-film photovoltaic device formation substrate 1. Further, the plate 41b disposed at the front of the reference processing surface 33 and the plate 41c disposed at the back of the reference processing surface 33 are respectively driven under the control such that the plates 41b and 41c horizontally move outward (forward and backward) in the transporting direction (the directions C and D of FIG. 3) of the thin-film photovoltaic device formation substrate 1 while firmly pressing the thin-film photovoltaic device formation substrate 1.

Next, a laser patterning method according to a first embodiment of the invention will be described by exemplifying a case in which the laser patterning apparatus shown in FIG. 1 is used.

The thin-film photovoltaic device formation substrate 1 is drawn out from the unwinding roll 2 to reach the processing room 10. Then, after the thin-film photovoltaic device formation substrate 1 is positioned, the elevating device (not shown) is operated to cause the processing stage 30 to approach the thin-film photovoltaic device formation substrate 1, and the thin-film photovoltaic device formation substrate 1 is disposed at a predetermined position of the processing stage 30.

The method of positioning the thin-film photovoltaic device formation substrate 1 is not particularly limited. The generally known method may be adopted. For example, a positioning method may be used in which a positioning sensor ends the positioning using a marker hole as a reference. Further, the thin-film photovoltaic device formation substrate 1 and the reference processing surface 33 of the processing stage are away from each other by a predetermined distance when the thin-film photovoltaic device formation substrate 1 are being transported and positioned.

Next, the suction device 35 is operated to suction the suction holes 34 by the negative pressure generated therefrom, so that the peripheral edge of the thin-film photovoltaic device formation substrate 1 is suctioned and fixed to the reference processing surface 33. Then, the plates 41a, 41b, and 41c are respectively pressed against the thin-film photovoltaic device formation substrate 1 and then are horizontally moved toward the outer periphery of the processing stage, simultaneously with or subsequently to the start of the operation of the suction device 35, so that the outer periphery of the processing region of the thin-film photovoltaic device formation substrate 1 is stretched outward in the width direction (the directions A and B of FIG. 3) and forward and backward in the transporting direction (the directions C and D of FIG. 3).

Since the outer periphery of the processing region of the thin-film photovoltaic device formation substrate 1 is stretched by the plates 41a, 41b, and 41c so that tension is applied outward in the width direction and forward and backward in the transporting direction, the thin-film photovoltaic device formation substrate 1 is fixed to the reference processing surface 33 in an extremely flat state without warpage, looseness, wrinkles, and the like.

Then, the suction device 35 is operated while the thin-film photovoltaic device formation substrate 1 is fixed to the processing stage 30, a laser beam is output from the laser oscillator 21, and the laser output system 23 scans the laser processing surface in the X-Y direction. Through this procedure, the laser processing surface of the thin-film photovoltaic device formation substrate 1 is patterned by laser.

According to the embodiment, since the thin-film photovoltaic device formation substrate 1 may be fixed and disposed on the processing stage 30 in an extremely flat state without warpage, looseness, wrinkles, and the like, the processing precision is satisfactory and the yield is good. Further, even when a part of residual dust comes around the back surface of the thin-film photovoltaic device formation substrate 1, since the residual dust is discharged outside the system through the slit-like opening 32 of the processing stage 30, it is possible to suppress occurrence of a problem that the residual dust adheres to the thin-film photovoltaic device formation substrate 1.

First Modified Example of First Embodiment

A laser patterning apparatus according to a first modification of the first embodiment of the invention will be described by referring to FIG. 4.

Figure 4:
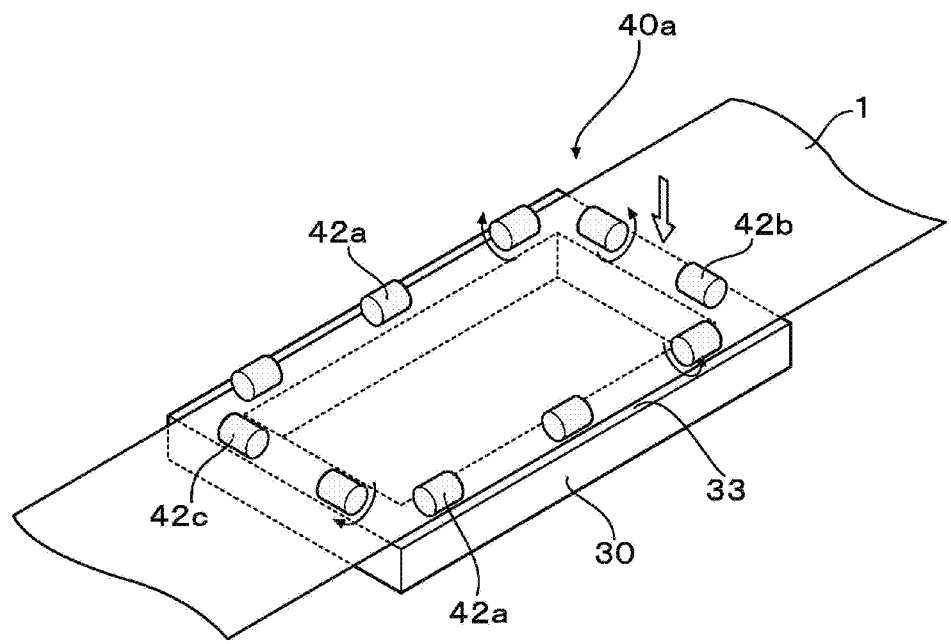
FIG. 4 is a schematic diagram illustrating a wrinkle removing device used in a first modified example of the laser patterning apparatus.

The laser patterning apparatus of this modification is basically similar to that of the first embodiment, but is different in that a wrinkle removing device 40a has a configuration shown in FIG. 4.

That is, the wrinkle removing device 40a has a configuration in which rollers 42a, 42b, and 42c formed of a material not damaging the thin-film photovoltaic device formation substrate 1 are disposed along the reference processing surface 33 specifically to be positioned respectively at both side edges of the reference processing surface 33 and the front and back edges of the reference processing surface 33. The material of the roller is not particularly limited, and rubber-based materials such as silicon rubber and urethane rubber may be used.

The rollers 42a, 42b, and 42c are away from the thin-film photovoltaic device formation substrate 1 by a predetermined distance when the thin-film photovoltaic device formation substrate 1 is being transported and positioned. However, when the wrinkles of the thin-film photovoltaic device formation substrate 1 are removed, the rollers 42a, 42b, and 42c are rotated by a driving device (not shown) in the direction indicated by the arrow of FIG. 4 so that the rollers are pressed against the thin-film photovoltaic device formation substrate 1 and the thin-film photovoltaic device formation substrate 1 moves toward the outer periphery of the processing stage 30. That is, when the wrinkles of the thin-film photovoltaic device formation substrate 1 are removed, the rollers 42a disposed at both side edges of the reference processing surface 33 are pressed against the thin-film photovoltaic device formation substrate 1 and are rotated in the direction in which the thin-film photovoltaic device formation substrate 1 moves outward in the width direction of the processing stage 30, and the rollers 42b disposed at the front of the reference processing surface 33 and the rollers 42c disposed at the back the reference processing surface 33 are respectively pressed against the thin-film photovoltaic device formation substrate 1 and are rotated in the direction in which the thin-film photovoltaic device formation substrate 1 moves forward and backward in the transporting direction of the processing stage 30.

Second Modified Example of First Embodiment

Figure 5:
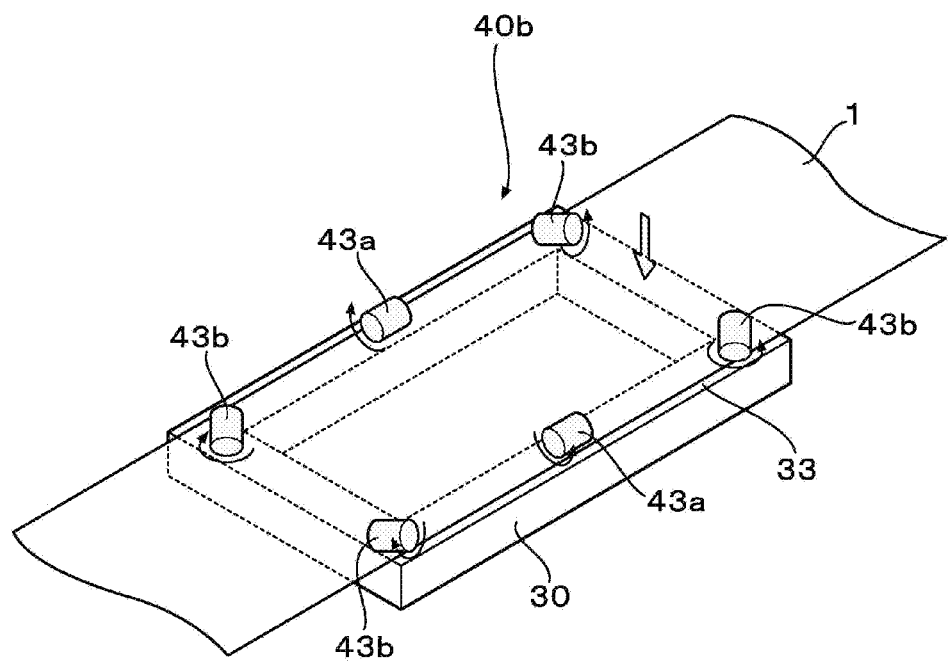
FIG. 5 is a schematic diagram illustrating a wrinkle removing device used in a second modified example of the laser patterning apparatus.

A laser patterning apparatus according to a second modification of the first embodiment of the invention will be described by referring to FIG. 5. The laser patterning apparatus of this modification is basically similar to the first embodiment, but is different in that a wrinkle removing device 40b has a configuration shown in FIG. 5.

That is, the wrinkle removing device 40b has a configuration in which a roller 43, formed of a material not damaging the thin-film photovoltaic device formation substrate 1, includes rollers 43a disposed along the reference processing surface 33 specifically to be positioned respectively at both side edges of the reference processing surface 33 and rollers 43b respectively and obliquely disposed at the corners of the reference processing surface 33. The material of the roller is not particularly limited, and rubber-based materials such as silicon rubber and urethane rubber may be used.

The rollers 43a and 43b are away from the thin-film photovoltaic device formation substrate 1 by a predetermined distance when the thin-film photovoltaic device formation substrate 1 is being transported and positioned. However, when the wrinkles of the thin-film photovoltaic device formation substrate 1 are removed, the rollers 43a and 43b are rotated by a driving device (not shown) in the direction indicated by the arrow of FIG. 5 so that the rollers are pressed against the thin-film photovoltaic device formation substrate 1 and the thin-film photovoltaic device formation substrate 1 moves toward the outer periphery of the processing stage 30. That is, when the wrinkles of the thin-film photovoltaic device formation substrate 1 are removed, the rollers 43a respectively disposed at both side edges of the reference processing surface 33 are pressed against the thin-film photovoltaic device formation substrate 1 and are rotated in the direction in which the thin-film photovoltaic device formation substrate 1 moves outward in the width direction of the processing stage 30, and the rollers 43b respectively disposed at the corners of the reference processing surface 33 are pressed against the thin-film photovoltaic device formation substrate 1 and are rotated obliquely outward so that tension is applied to the thin-film photovoltaic device formation substrate 1 forward and backward in the transporting direction of the processing stage 30.

Second Embodiment

A laser patterning apparatus according to a second embodiment of the invention will be described by referring to FIGS. 6 to 9. The laser patterning apparatus of the embodiment is basically similar to that of the first embodiment, but is different in that a processing stage and a wrinkle removing device are different from those of the first embodiment.

Figure 6:
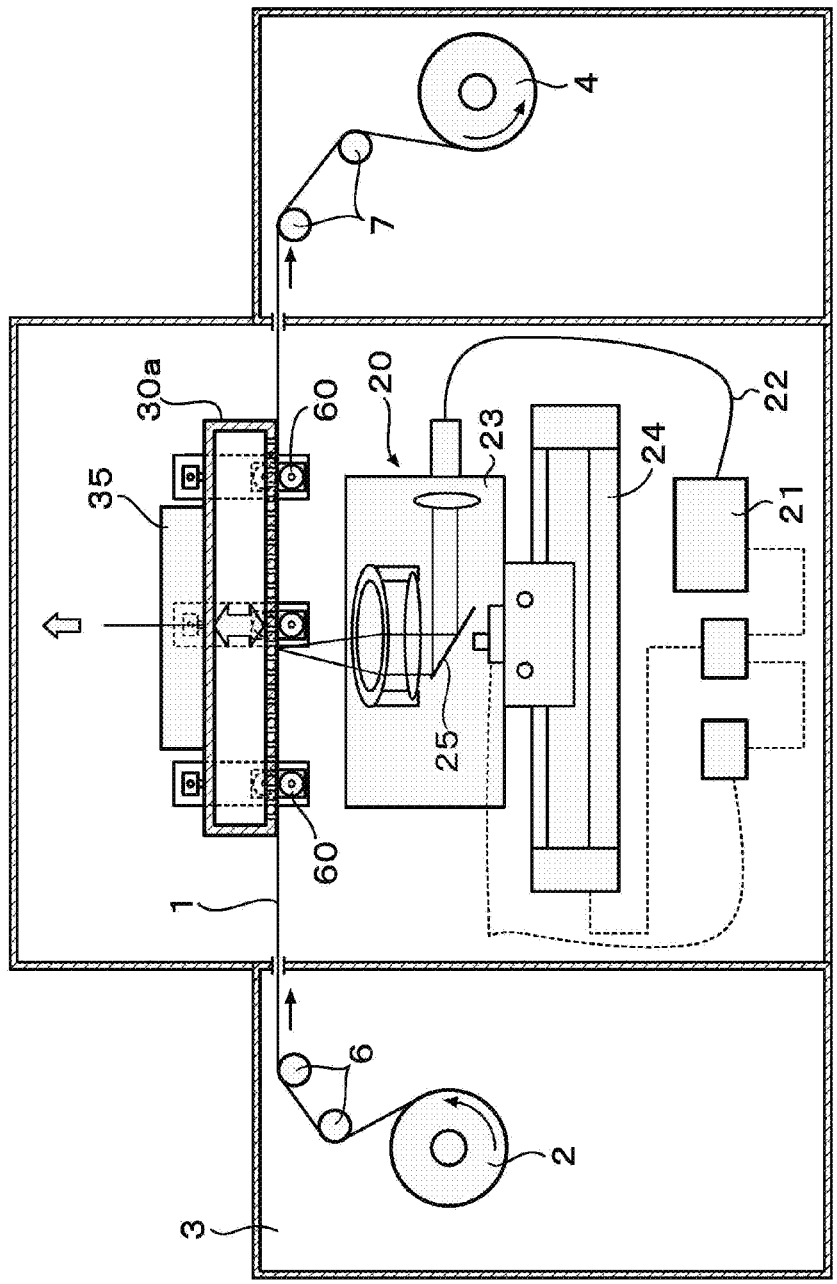
FIG. 6 is a schematic diagram illustrating a laser patterning apparatus according to a second embodiment of the present invention.
Figure 7:
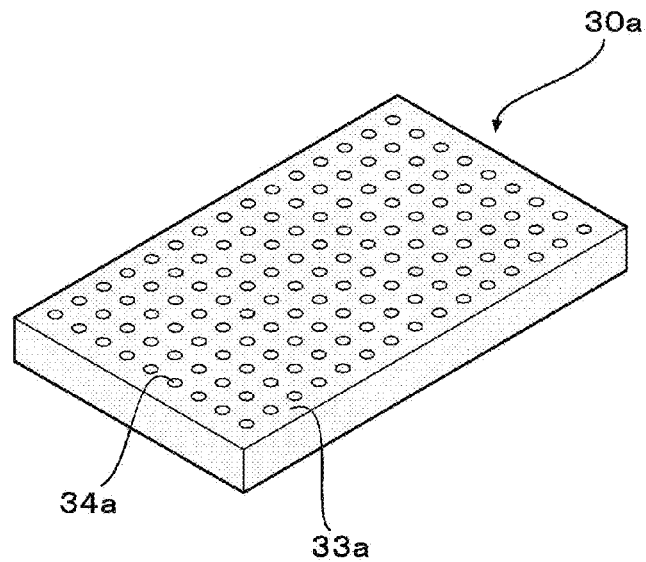
FIG. 7 is a schematic diagram illustrating a processing stage used in the laser patterning apparatus.

As shown in FIG. 7, in the embodiment, a processing stage 30a is formed in an elongated plate shape. Further, a plurality of suction holes 34a are formed in the reference processing surface 33a. When the suction device 35 (refer to FIG. 6) suctions the suction holes 34a by the negative pressure generated therefrom, the back surface of the processing region of the thin-film photovoltaic device formation substrate 1 is suctioned and fixed to the reference processing surface 33a.

The length of the processing stage 30a in the width direction is set to be shorter than the length of the thin-film photovoltaic device formation substrate 1 in the width direction. The length of the processing stage is desirably 10 to 50 mm shorter and more desirably 30 to 40 mm shorter. Since the length of the processing stage 30a in the width direction is shorter than the length of the thin-film photovoltaic device formation substrate 1 in the width direction, the back surface of the thin-film photovoltaic device formation substrate 1 may be brought into contact with the reference processing surface of the processing stage 30a while both ends of the thin-film photovoltaic device formation substrate 1 are held by grippers 60 (refer to FIGS. 8 and 9). As a result, it is possible to suppress occurrence of wrinkles by efficiently removing looseness or warpage of the thin-film photovoltaic device formation substrate 1.

Figure 8:
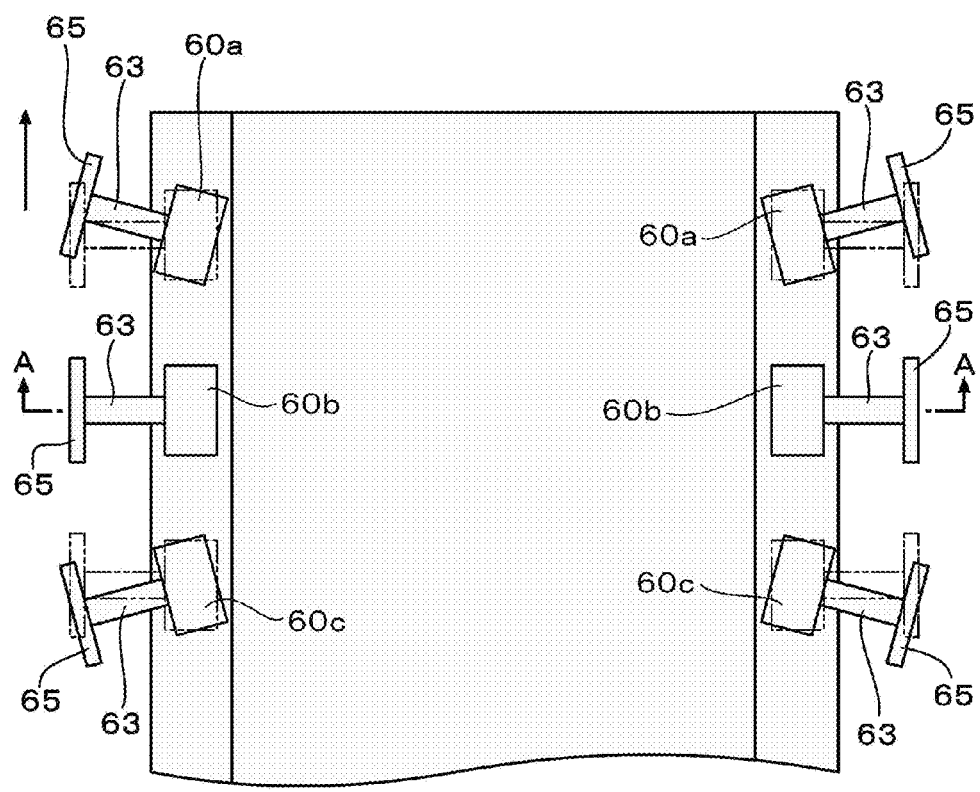
FIG. 8 is a bottom view illustrating a wrinkle removing device of the laser patterning apparatus.
Figure 9:
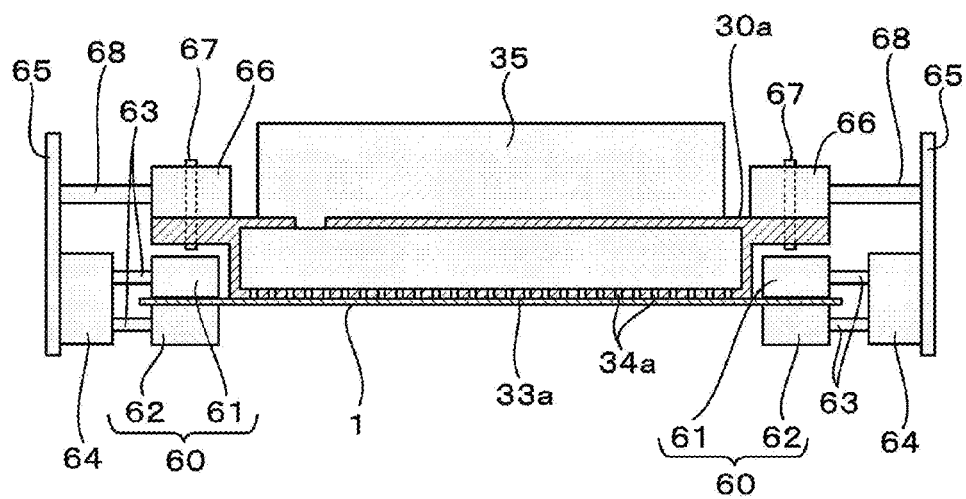
FIG. 9 is a cross-sectional view taken along the line A-A of FIG. 8.

Referring to FIGS. 8 and 9, a plurality of pairs (three pairs in the embodiment) of left and right grippers 60a, 60b, and 60c (hereinafter, collectively referred to as a "gripper 60") are disposed at both ends in the width direction of the thin-film photovoltaic device formation substrate 1 disposed at the back surface of the processing stage 30a.

The gripper 60 includes an upper pushing portion 61 and a lower pushing portion 62. The upper and lower pushing portions are respectively connected to an opening and closing device 64 through respective support shafts 63. The opening and closing device 64 is configured to open and close the upper pushing portion 61 and the lower pushing portion 62 through the support shafts 63.

The material of the gripper 60 is not particularly limited, and may be a material not damaging the thin-film photovoltaic device formation substrate 1. For example, silicon rubber, urethane rubber, nitrile rubber, fluorine rubber, and the like may be used.

Further, roughening may be performed on the surface of the gripper 60. When unevenness is provided on the surface of the gripper 60, it is possible to prevent slipping when the thin-film photovoltaic device formation substrate 1 is held by the gripper 60. For this reason, it is possible to efficiently stretch the thin-film photovoltaic device formation substrate 1 by applying tension thereto.

The opening and closing device 64 is connected to an air cylinder 66 installed on the processing stage 30a through a support plate 65 and a rod 68. Then, when the rod 68 is expanded and contracted by the operation of the air cylinder 66, the gripper 60 moves close to or away from the thin-film photovoltaic device formation substrate 1.

Further, the air cylinder 66 is configured to be rotatable about the processing stage 30a through the support shaft 67. Accordingly, as shown in FIG. 8, the angle of the support shaft 67 of the gripper 60 with respect to the transporting direction of the thin-film photovoltaic device formation substrate 1 is adjustable by a predetermined angle within a range of desirably 30° to 150°.

In the case of the embodiment, the pair of left and right grippers 60b positioned at the center in the transporting direction of the thin-film photovoltaic device formation substrate 1 is disposed such that the support shaft 67 substantially extends in the direction perpendicular to the transporting direction, the pair of left and right grippers 60a positioned at the front in the transporting direction is disposed such that the support shaft 67 obliquely extends outward to the front in the transporting direction, and the pair of left and right grippers 60c positioned at the back in the transporting direction is disposed such that the support shaft 67 obliquely extends outward to the back in the transporting direction.

Next, a laser patterning method according to a second embodiment of the invention will be described by exemplifying a case in which the laser patterning apparatus shown in FIG. 6 is used.

The thin-film photovoltaic device formation substrate 1 is drawn out from the unwinding roll 2 to be guided to the laser processing room 10. Then, after the thin-film photovoltaic device formation substrate 1 is positioned, the processing stage 30 is caused to approach the thin-film photovoltaic device formation substrate 1 by operating the elevating device (not shown), and the thin-film photovoltaic device formation substrate 1 is disposed at a predetermined position of the processing stage 30.

Next, the suction device 35 is operated to suction the suction holes 34a by the negative pressure generated therefrom, so that the back surface of the thin-film photovoltaic device formation substrate 1 is suctioned and fixed onto a reference processing surface 33a.

Then, the opening and closing device 64 is operated so that the upper pushing portion 61 and the lower pushing portion 62 of the gripper 60 pinch both sides of the thin-film photovoltaic device formation substrate 1. Subsequently, the air cylinder 66 is operated so that the rod 68 further protrudes and thus both sides of the thin-film photovoltaic device formation substrate 1 pinched by the gripper 60 are stretched outward.

As a result, the pair of left and right grippers 60b positioned at the center in the transporting direction of the thin-film photovoltaic device formation substrate 1 stretches both side edges of the thin-film photovoltaic device formation substrate 1 outward in the width direction, the pair of left and right grippers 60a positioned at the front in the transporting direction stretches both side edges of the thin-film photovoltaic device formation substrate 1 obliquely forward in the transporting direction, and the pair of left and right grippers 60c positioned at the back in the transporting direction stretches both side edges of the thin-film photovoltaic device formation substrate 1 obliquely backward in the transporting direction.

In this manner, since the back surface of the thin-film photovoltaic device formation substrate 1 is suctioned and fixed to the processing stage and the outer periphery of the processing region of the thin-film photovoltaic device formation substrate 1 is stretched outward in the width direction and forward and backward in the transporting direction, the laser processing surface of the thin-film photovoltaic device formation substrate 1 without warpage, looseness, wrinkles, and the like is disposed and fixed to a predetermined position of the reference processing surface 33a.

Then, in this state, a laser beam is output from the laser oscillator 21 and the laser output system 23 scans the laser processing surface in the X-Y direction so as to pattern the laser processing surface of the thin-film photovoltaic device formation substrate 1.

Even in the embodiment, since the laser processing surface of the thin-film solar cell formation substrate 1 without warpage, looseness, wrinkles, and the like can be disposed and fixed to a predetermined position of the reference processing surface 33, the laser beam may be emitted to the laser processing surface of the thin-film photovoltaic device formation substrate 1 in the state where the surface is extremely flat. For this reason, the processing precision is satisfactory and the yield is good.

Further, the gripper 60 may be configured as a pair of rollers like the second modification of the first embodiment, and in this case, tension may be applied to the thin-film photovoltaic device formation substrate 1 by rotating the rollers.

EXAMPLES

Example 1

A sample was prepared by forming 2 μm of a silicon film on a polyimide film. The laser patterning was performed in a manner such that the sample was suctioned and fixed to the processing stage 30a by suctioning the suction holes 34a using the negative pressure generated from the laser patterning apparatus shown in FIGS. 6 to 9, the sample was stretched in the respective directions of the gripper 60a horizontally inclined by 45° with respect to the advancing direction of the thin-film photovoltaic device formation substrate 1, the gripper 60b horizontally inclined by 90° with respect to the advancing direction of the thin-film photovoltaic device formation substrate 1, and the gripper 60c horizontally inclined by 135° with respect to the advancing direction of the thin-film photovoltaic device formation substrate 1, and a laser beam was operated to be emitted to the sample.

During the laser patterning, the sample was maintained in a flat state without warpage, looseness, wrinkles, and the like, and the laser patterning was performed with good processing precision.

Comparative Example 1

In Comparative Example 1, the thin-film photovoltaic device formation substrate 1 was stretched by grips 60*a*, 60*b*, and 60*c* horizontally inclined by 90° with respect to the advancing direction of the thin-film photovoltaic device formation substrate 1. However, stripe-like wrinkles occurred along the transporting direction of the sample. The stripe-like wrinkles were not removed even when tension increases.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments can be combined, as would be understood by one of skill in the art.

This application is based on, and claims priority to, Japanese Patent Application No. 2010-208750, filed on Sep. 17, 2010. The disclosure of the priority application, in its entirety, including the drawings, claims, and the specification thereof, is incorporated herein by reference.

What is claimed is:

1. A laser patterning apparatus comprising:
a processing unit that includes a reference processing surface on which a flexible substrate having a thin film formed thereon and transported by a roll-to-roll method is disposed;
a wrinkle removing device that removes wrinkles of the flexible substrate disposed on the reference processing surface; and
a laser beam scanner that emits a laser beam to the thin film formed on the flexible substrate to perform scanning along a predetermined line,
wherein the wrinkle removing device is configured as a stretching mechanism that stretches an outer periphery of a processing region of the flexible substrate so that tension is applied outward in the width direction and forward and backward in the transporting direction.

2. The laser patterning apparatus according to claim 1,
wherein the reference processing surface is formed in a shape that comes into contact with only the peripheral edge of the flexible substrate.

3. The laser patterning apparatus according to claim 2,
wherein the processing unit includes a residual dust suctioning portion that is provided at a back surface side of an inner portion of the reference processing surface, the inner portion not coming into contact with the flexible substrate.

4. The laser patterning apparatus according to claim 1,
wherein the reference processing surface is formed in a shape that comes into contact with at least a back surface side of the processing region of the flexible substrate.

5. The laser patterning apparatus according to claim 1,
wherein the processing unit includes a processing stage with a suction mechanism that suctions the flexible substrate coming into contact with the reference processing surface onto the reference processing surface.

6. The laser patterning apparatus according to claim 5,
wherein the suction mechanism includes a suction surface with a suction hole and a mechanism suctioning the inside of the suction surface.

7. The laser patterning apparatus according to claim 1,
wherein the reference processing surface is disposed such that a part of the flexible substrate comes into contact with at least the periphery of the processing unit, and
wherein the wrinkle removing device includes a plate that is formed of a material not damaging the flexible substrate and a driving mechanism that presses the plate against the flexible substrate and moves the plate toward an outer periphery of the processing unit.

8. The laser patterning apparatus according to claim 1,
wherein the reference processing surface is disposed such that a part of the flexible substrate comes into contact with at least the periphery of the processing unit, and
wherein the wrinkle removing device includes a roller that is formed of a material not damaging the flexible substrate and a rotating mechanism that presses the roller against the flexible substrate and rotates the roller so that the flexible substrate moves toward an outer periphery of the processing unit.

9. The laser patterning apparatus according to claim 1,
wherein the wrinkle removing device includes a gripping mechanism that grips and stretches both sides of the flexible substrate,
wherein the gripping mechanism includes gripping portions that are provided at least three positions for each side of the processing unit along the transporting direction and that are formed of a material not damaging the flexible substrate, and
wherein the gripping portion is configured such that the stretching direction and the stretching force are individually adjustable.

10. The laser patterning apparatus according to claim 9,
wherein the gripping portion is configured such that the stretching direction is adjustable in a angular range from 30° to 150° with respect to the transporting direction of the flexible substrate.

11. The laser patterning apparatus according to claim 9,
wherein the gripping portion includes a pair of rollers pinches both surfaces of the flexible substrate.

12. A laser patterning method comprising:
disposing a flexible substrate on a reference processing surface of a processing unit while transporting the flexible substrate having a thin film formed thereon by a roll-to-roll method;
removing wrinkles of the flexible substrate by stretching an outer periphery of a processing region of the flexible substrate so that tension is applied outward in the width direction and forward and backward in the transporting direction; and
patterning the thin film formed on the flexible substrate by use of a laser beam in such a state.

13. The laser patterning method according to claim 12,
wherein the reference processing surface to be used has a shape that comes into contact with only the peripheral edge of the flexible substrate, and
wherein the wrinkles of the flexible substrate are removed in a manner such that only the peripheral edge of the flexible substrate comes into contact with the reference processing surface while the flexible substrate is being transported by a roll-to-roll method, and is stretched toward the outer periphery of the reference processing surface while the peripheral edge of the flexible substrate is being pressed against the reference processing surface.

14. The laser patterning method according to claim 12,
wherein the reference processing surface to be used has a shape that comes into contact with at least a back surface side of the processing region of the flexible substrate, and
wherein the wrinkles of the flexible substrate are removed in a manner such that the back surface side of the processing region of the flexible substrate comes into contact with the reference processing surface while the flexible substrate is being transported by a roll-to-roll method, both sides of the flexible substrate are gripped by gripping portions provided at least three positions for each side of the processing unit along the transporting direction, and the flexible substrate is stretched by the gripping portions so that tension is applied outward in the width direction of the flexible substrate and forward and backward in the transporting direction.

\* \* \* \* \*